(12) United States Patent
Takemoto et al.

(10) Patent No.: US 6,489,786 B1
(45) Date of Patent: Dec. 3, 2002

(54) NON-ISOLATED TYPE VOLTAGE SENSOR

(75) Inventors: Hisashi Takemoto, Shizuoka-ken (JP); Syuji Satake, Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 26 days.

(21) Appl. No.: 09/686,368

(22) Filed: Oct. 12, 2000

(30) Foreign Application Priority Data

Oct. 25, 1999 (JP) .......................................... 11-302129

(51) Int. Cl.$^7$ .............................................. G01N 27/20
(52) U.S. Cl. .................... 324/713; 324/117 R; 324/120
(58) Field of Search ............................... 324/522, 427, 324/117, 434, 713, 433, 120, 126, 117 R, 117 H, 158.1; 320/164

(56) References Cited

U.S. PATENT DOCUMENTS

| | | | | |
|---|---|---|---|---|
| 5,438,270 A | * | 8/1995 | Harper et al. | 324/427 |
| 5,451,881 A | * | 9/1995 | Finger | 324/433 |
| 5,481,194 A | * | 1/1996 | Schantz et al. | 324/522 |
| 5,672,952 A | * | 9/1997 | Szepesi | 320/164 |
| 5,808,469 A | * | 9/1998 | Kopera | 324/434 |
| 5,896,028 A | * | 4/1999 | Arai | 324/117 |

FOREIGN PATENT DOCUMENTS

| | | |
|---|---|---|
| DE | 297 20 533 U1 | 2/1998 |
| JP | 09 257837 | 10/1997 |
| JP | 9-257837 | 10/1997 |
| JP | 09 312939 | 3/1998 |

OTHER PUBLICATIONS

Horowitz, P., "The Art of Electronics", Second Edition, 1991, pp. 320, 426, 427. The Publication Month was not Provided.

* cited by examiner

*Primary Examiner*—Michael Sherry
*Assistant Examiner*—Anand B Amin
(74) *Attorney, Agent, or Firm*—Finnegan, Henderson, Farabow, Garrett, & Dunner, L.L.P.

(57) ABSTRACT

A non-isolated type voltage sensor is provided between a battery of less than 60 V and a circuit having a resistor, an end of which is connected to a wire harness while another end is connected to a reference power supply. The non-isolated type voltage sensor includes voltage dividing circuits, which include plural resistors connected in series such that those resistors are connected to the battery in parallel so as to obtain a voltage proportional to a terminal voltage of the battery and less than the reference voltage at a desired voltage dividing point of the plural resistors, a voltage follower, which receives an input of a voltage from the voltage dividing point of the voltage dividing circuit, and a voltage-current conversion circuit including a FET so as to supply a current proportional to a low impedance output voltage obtained through the voltage follower to the ground through a resistor.

5 Claims, 4 Drawing Sheets

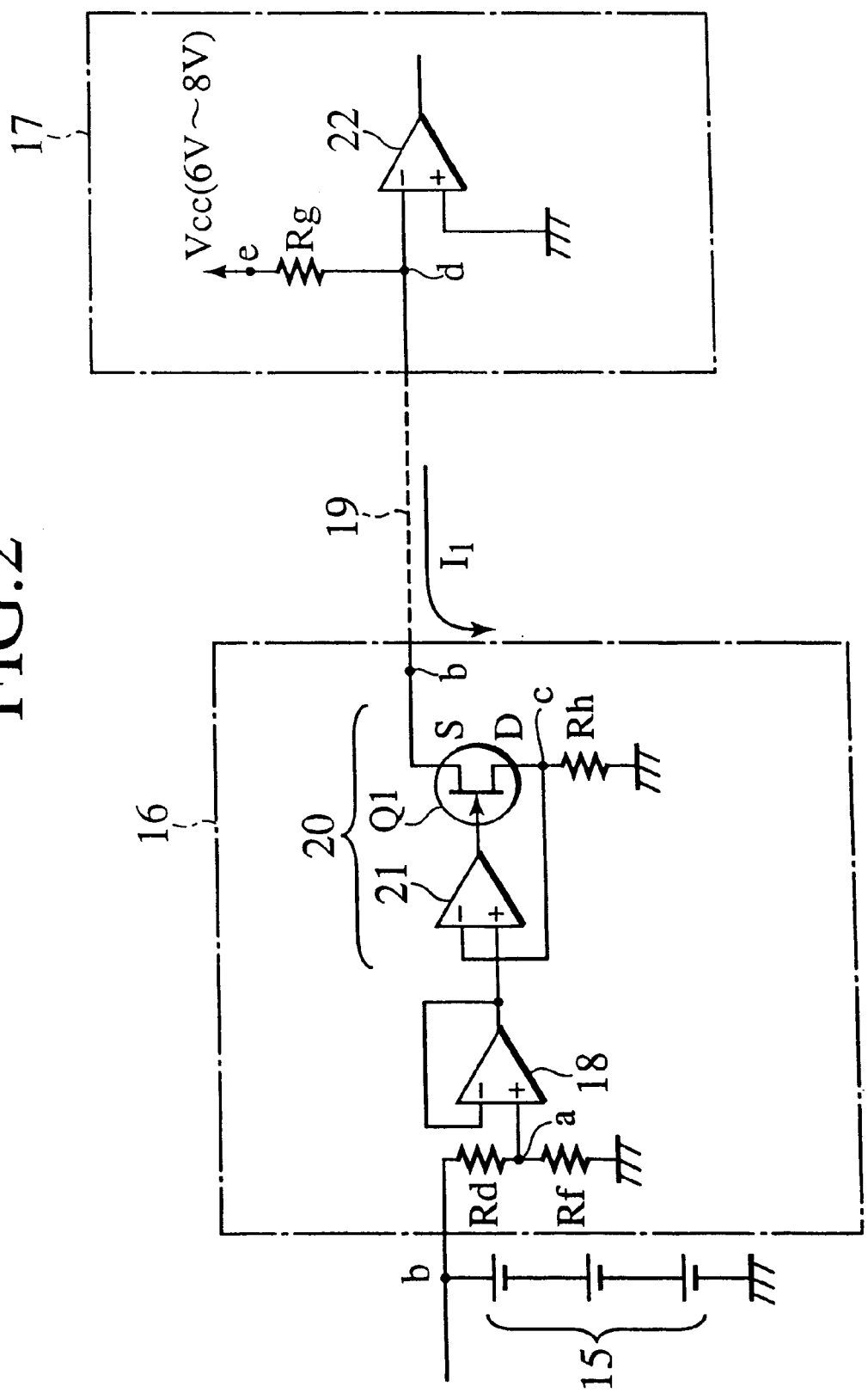

NON-ISOLATED TYPE VOLTAGE SENSOR

BACKGROUND OF THE INVENTION

1. Field of the Invention

The present invention relates to a non-isolated voltage sensor provided specifically between a high-voltage battery and a circuit having a pull-up resistance one end of which is connected to a cable while the other end thereof is connected to a reference power supply, and more particularly to a non-isolated type voltage sensor capable of sending a detected voltage accurately without considering a cable length.

2. Description of the Related Art

In a recent high-voltage vehicle containing a plurality of batteries of 12V or the like connected to each other, for example, there is such a trend that a plurality of wire harnesses are included in a junction box (J/B) and sensors, measuring circuits and the like are accommodated in this junction box if possible. The location of this junction box in a vehicle compartment varies depending on the vehicle type.

However, because a conventional voltage measuring circuit for use in automobile has a limitation on the wire harness length, there is such a problem that the locations of the voltage measuring circuit and battery controller in the vehicle compartment cannot be changed. Further, if the vehicle type is changed so that the location of the junction box is changed, there is another problem that the sensor and voltage measuring circuit cannot be accommodated in the junction box because the wire harness length is limited.

To solve this problem, Japanese Patent Application Laid-Open No. H9-257837 has disclosed a conventional voltage sensor which eliminates the necessity of considering the harness length.

A voltage sensor 10 shown in FIG. 1 comprises a power supply line 13 for supplying an electric power from a battery 2 to a load 12 and an isolated type detector 16 having a hall device 15 in a gap of a magnetic core 14. The power supply wire 13 passes through a through hole of the detector 16 as a primary side wire.

This voltage sensor further comprises a differential amplifying circuit 17 for differential-amplifying an output from both ends of the hall device 15, a current buffer 18 connected to this differential amplifying circuit 17 and the like. An output wire 19 of the current buffer 18 is wound around the core 14 of the isolated type detector 16 by a predetermined number of turns as a secondary side wire. Then, a voltage signal is sent to a battery controller 22 through a harness 20.

An end of an input circuit 23 of this battery controller 22 is connected to an input terminal of the voltage follower 24 and the harness 20 while the other end thereof is connected to the ground. This ground is a weak current ground which is different from a ground for the battery 2 and the voltage sensor 10.

That is, when the detector 16 is used, magnetic flux proportional to a current flowing from the battery 2 to the load 12 is generated and then, the hall device 15 detects that magnetic flux as a hall voltage, so that the differential amplifying circuit 17 and a current buffer 18 supply a current in a direction which makes zero a hall voltage to the secondary wire side.

The current flowing to the secondary wire side is sent to the input circuit 23 of the battery controller 22 through the harness 20. That is, because an output from the voltage sensor 10 becomes an output of current, the harness length can be neglected (the harness may be long).

However, because in this voltage sensor 10, the battery voltage is not detected directly, there is a problem in terms of a detection accuracy although the harness length can be neglected. Further, there is another problem that this voltage sensor 10 necessitates the core, hall device, differential amplifying circuit and the like, the quantity of the components increases.

SUMMARY OF THE INVENTION

The present invention has been achieved to solve the above described problems and therefore, an object of the invention is to provide a non-isolated type voltage sensor for a battery of vehicle in which the restriction on the harness length is mild, the non-isolated type voltage sensor being capable of measuring a voltage accurately without use of the hall device.

The non-isolated type voltage sensor of the present invention is a non-isolated type voltage sensor provided between a battery and a circuit containing a pull-up resistor which is connected to a reference power supply and a cable.

This non-isolated type voltage sensor comprises a voltage dividing circuit, a voltage follower and a voltage-current conversion circuit.

The voltage dividing circuit is comprised of plural resistors connected in series and connected to the battery in parallel. Then, a voltage proportional to a terminal voltage of the battery and less than the voltage of the reference power supply is obtained at a desired voltage dividing point of these plural resistors.

Because the voltage follower converts a high input impedance to a low input impedance, it takes a role as a buffer circuit for removing respective influences between the voltage dividing circuit and the voltage-current circuit. Therefore, if a voltage at the voltage dividing point of the voltage dividing circuit is inputted to the voltage follower, a low impedance output voltage is obtained.

Next, the voltage-current conversion circuit supplies a current proportional to a low impedance output voltage obtained through the voltage follower to the ground through the cable and output resistor.

This voltage-current conversion circuit comprises: a field effect transistor a source of which is connected to the cable while a drain thereof is connected to the output resistor; an output resistor which is connected to a drain of the field effect transistor and the ground, the output resistor having a resistance higher than a resistance of the pull-up resistor; and an amplifier in which an output of the voltage follower is connected to a non-inverted input thereof, an inverted input thereof is connected to the output resistor and an output thereof is connected to a gate of the field effect transistor.

Thus, if the voltage dividing circuit obtains a voltage proportional to the battery voltage at the voltage dividing point, the field effect transistor is turned ON immediately through the voltage follower.

That is, because a current supplied to the gate of the field effect transistor is made very small when the field effect transistor is turned ON, even if the voltage at the voltage dividing point is converted to current, the current flowing to the ground through the cable becomes a current accurately proportional to a detection current at the voltage dividing point.

Further, the non-isolated type voltage sensor of the present invention is a non-isolated type voltage sensor provided between a battery and a circuit having a first pull-up resistor which is connected to the ground and the cable.

This non-isolated type comprises a voltage detecting circuit and a voltage-current conversion circuit.

The voltage detecting circuit obtains a voltage proportional to a battery voltage at the voltage dividing point and supplies a first current proportional to a low impedance output voltage obtained from a voltage at this voltage dividing point to the ground through a first output resistor.

The voltage-current conversion circuit supplies a second current proportional to a voltage signal determined based on the first current to the cable using a second output resistor.

This non-isolated type voltage sensor is provided between a circuit which is connected to the same type of ground as ground of the battery and the cable and the first pull-up resistor and which has a differential amplifying circuit carrying out differential amplification with the ground as a reference and the battery.

The voltage detecting circuit comprises a voltage dividing circuit, a voltage follower and a first voltage-current conversion circuit. The first voltage-current conversion circuit comprises: a first field effect transistor a source of which is connected to an input of the second voltage-current conversion circuit while a drain thereof is connected to the output resistor; a first output resistor which is connected to a drain of the first field effect transistor and the ground; and a first amplifier in which an output of the voltage follower is connected to a non-inverted input thereof, an inverted input thereof is connected to the output resistor and an output thereof is connected to a gate of the field effect transistor.

The voltage detecting circuit further comprises a second voltage-current conversion circuit. The second voltage-current conversion circuit comprising: a second pull-up resistor which is connected to the reference power supply and a source of the first field effect transistor; a second output resistor which is connected to the reference power supply; a second field effect transistor a source of which is connected to the second output resistor while a drain thereof is connected to the cable; and a second amplifier in which a non-inverted input thereof is connected to a source of the first field effect transistor, a non-inverted input thereof is connected to the second output resistor and a source of the second field effect transistor and an output thereof is connected to a gate of the second field effect transistor.

As described above, in the non-isolated type voltage sensor of the present invention, a high voltage of the battery is detected by the voltage dividing circuit so as to obtain a voltage proportional to a low impedance output voltage obtained by converting impedance. Consequently, if this non-isolated type voltage sensor is provided between a high voltage battery and a circuit having a pull-up resistor which is connected to a cable and the reference power supply, a current proportional to the detected voltage flows from this cable to the output resistor and ground in succession immediately.

That is, because the detected voltage signal is supplied as a current signal to the cable, a current signal proportional to the voltage signal is obtained at a subsequent circuit even if the cable is long. As a result, there is an effect that freedom of the layout of the non-isolated type voltage sensor in the vehicle compartment is increased.

Further, because the voltage-current conversion circuit employs the field effect transistor, a current for driving the gate can be minimized. Thus, there is an effect that an accurate current proportional to the detected voltage can be obtained even if the cable is long.

Further, in the non-isolated type voltage sensor provided between a high voltage battery and a circuit having a first pull-up resistor which is connected to a cable and the ground, a first voltage-current conversion circuit having a first field effect transistor and a second voltage-current conversion circuit having a second field effect transistor are provided. Then, a voltage signal corresponding to a current flowing through the first field effect transistor by the second pull-up resistor connected to the reference power supply in the second voltage-current conversion circuit is generated and this voltage is converted to current by the second voltage-current conversion circuit and sent to a subsequent circuit.

As a result, a stabilized current signal is sent to the subsequent stage, so that a difference of the current signal can be amplified with respect to a common ground to the battery. Consequently, there is an effect that a highly accurate differential signal can be obtained.

Further, there is an effect also that the circuit can be produced in a small size because no hall device is necessitated.

BRIEF DESCRIPTION OF THE DRAWINGS

FIG. 2 is a schematic structure diagram of the non-isolated type voltage sensor according to the first embodiment;

DESCRIPTION OF THE PREFERRED EMBODIMENTS

<First Embodiment>

Figure 1:
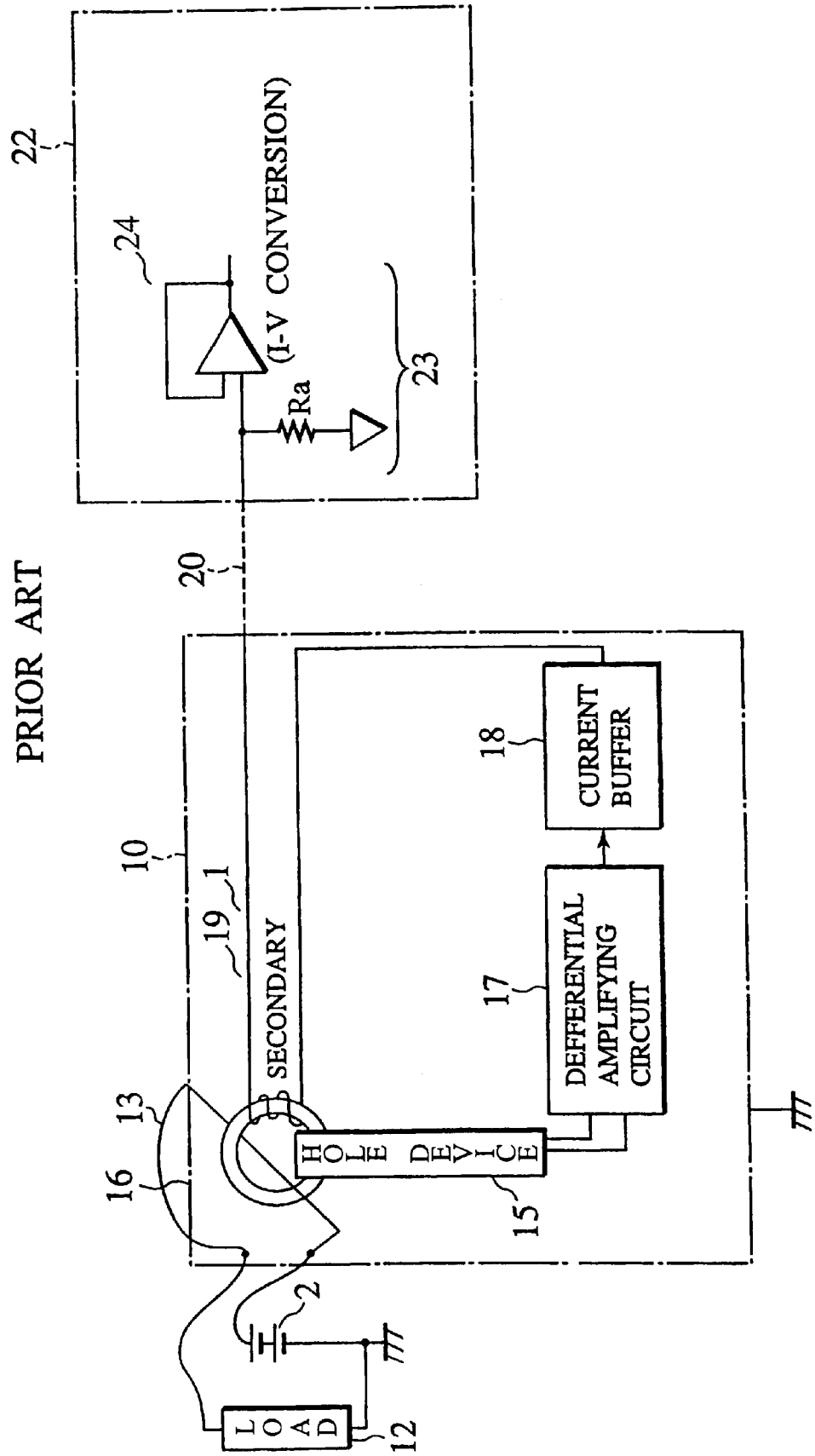
FIG. 1 is a structure diagram of a conventional isolated type voltage sensor.

FIG. 2 is a schematic structure diagram of a non-isolated type voltage sensor of an automobile battery according to the first embodiment. The non-isolated type voltage sensor 16 shown in FIG. 2 detects a voltage of the battery less than 60V (for example, 42V) and converts this voltage to current and transmits it to a battery controller 17 through a wire harness 19.

In the aforementioned non-isolated type voltage sensor 16, a connecting end b of a resistor $R_d$ is connected to the battery 15 while a connecting end a thereof is connected to a resistor $R_f$.

A voltage follower 18 is connected to a dividing point a (corresponded to the connecting end a) between the resistor $R_d$ and resistor $R_f$ so as to convert impedance and an output of the voltage follower 18 is connected to a voltage-current conversion circuit 20.

This voltage-current conversion circuit 20 comprises an amplifier 21, a $FETQ_1$ and a resistor $R_h$ (called first output resistor also). An output of the amplifier 21 is connected to a gate of the $FETQ_1$ and a drain of the $FETQ_1$ is connected to a connecting end c of the resistor $R_h$. A non-inverted input of the amplifier 21 is connected to an output of the voltage follower 18 and an inverted input is connected to the connecting end c of the resistor $R_h$.

On the other hand, an input interface of the battery controller 17 is comprised of a resistor $R_g$ and a differential amplifier 22. A connecting end d of the resistor $R_g$ (called first pull-up resistor also) is connected to the wire harness 19 and a connecting end e thereof is connected to a reference power supply $V_{cc}$.

The connecting end d of this resistor $R_g$ is connected to an inverted input of the differential amplifier 22 so as to execute differential amplification. This voltage is sampled by an operating portion (not shown) every 1 msec and each time when a predetermined quantity of samples are collected, average data is obtained. Then, by calculating a current $I_1$ from this average data, a battery voltage is estimated.

A ground of the aforementioned battery 15, a ground of the non-isolated type voltage sensor 16 and a ground of the battery controller 17 do not have to be used with distinction as a strong current ground when the battery 15 is 42V or as a weak current ground. Thus, they use the same ground.

An operation of the non-isolated type voltage sensor 16 of the first embodiment having the above described structure will be described below. In this case, the reference power supply $V_{cc}$ to be applied to the resistor $R_g$ of the battery controller 17 is 6V–8V.

If a discharge current of the battery 15 flows through the resistors $R_d$, $R_f$ of the non-isolated type voltage sensor 16, a voltage dividing value (5V max.) based on the resistors $R_d$, $R_f$ is generated at the dividing point a. This voltage dividing value is converted to a low impedance output voltage by the voltage follower 18 as a detected voltage for the battery 15.

That is, an output of the voltage follower 18 is inputted to plus of the amplifier 21 of the voltage-current conversion circuit 20 and then, the amplifier 21 sends a weak signal of a low impedance to the gate of the $FETQ_1$.

Consequently, immediately, the $FETQ_1$ is turned ON so that the current $I_1$ flows from the resistor $R_g$ of the battery controller 17 through the wire harness 19 to the $FETQ_1$ (CMOS type), resistor $R_h$ and ground in succession.

That is, because the current flowing to the gate of the $FETQ_1$ when the $FETQ_1$ is turned ON is adjusted to a very small value by the amplifier 21, even if the voltage at the voltage dividing point is converted to current, the current flowing to the ground through the cable becomes a current accurately proportional to the detection current at the voltage dividing point. Therefore, only the current $I_1$ corresponding to the voltage dividing value (detected voltage) flows through the harness 19 immediately by the $FETQ_1$.

Thus, the output of the non-isolated type voltage sensor 16 becomes current signal, so that an influence of the wire harness becomes very small. As a result, a restriction on layout of the non-isolated type voltage sensor 16 and the battery controller 17 is eliminated.

Figure 3A:
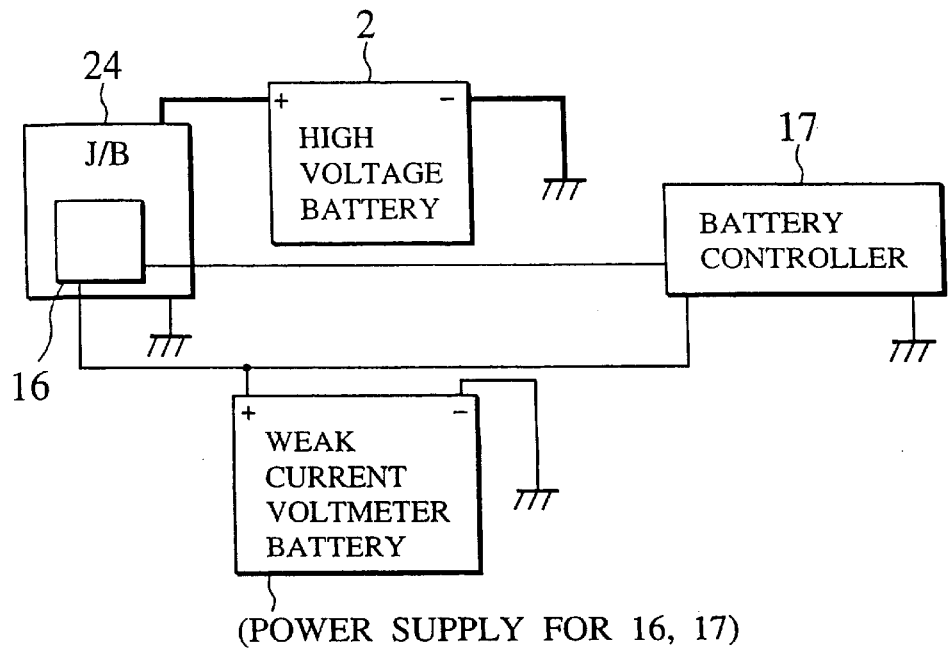
FIG. 3 is an explanatory diagram for explaining an application example of the non-isolated type voltage sensor of this embodiment.
Figure 3B:
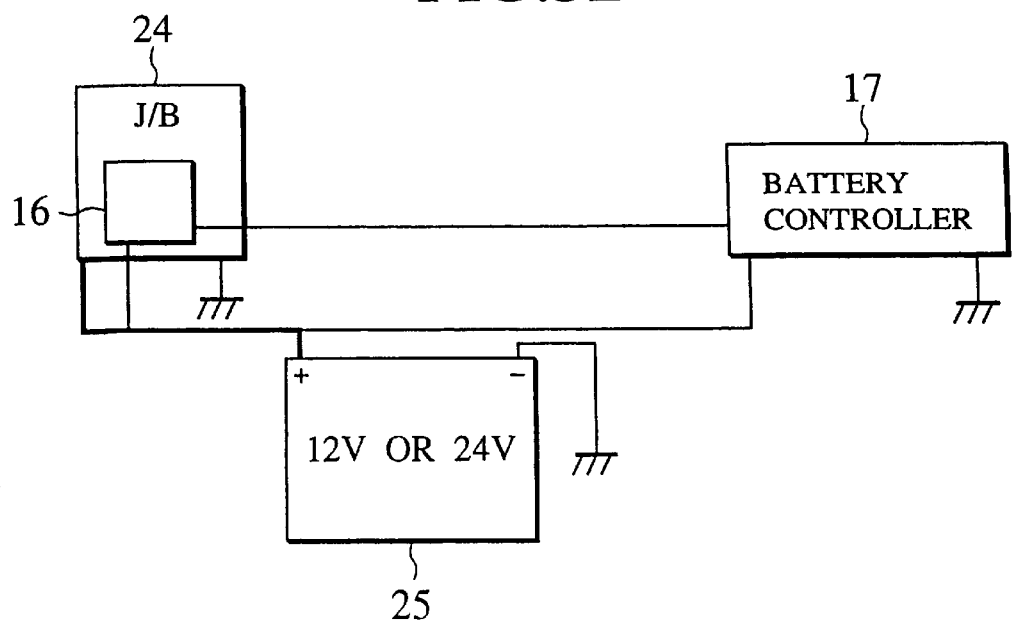

Thus, even if a high voltage battery 2 or 12V, 24V battery 25 is used as shown in FIG. 3A or 3B, the non-isolated type voltage sensor 16 can be provided within the junction box 24, so that a voltage from such a high voltage battery 2 or 12V, 24V battery can be converted to current signal and sent to the battery controller 17.

<Second Embodiment>

According to the above described first embodiment, the current $I_1$ flows to the $FETQ_1$ of the voltage-current conversion circuit 20 through the resistor $R_g$ of the battery controller 17 and a difference between a ground potential and a voltage generated by such a flow of current is amplified by the differential amplifier 22 of the battery controller 17. Thus, this system is not stable in terms of accuracy.

Figure 4:
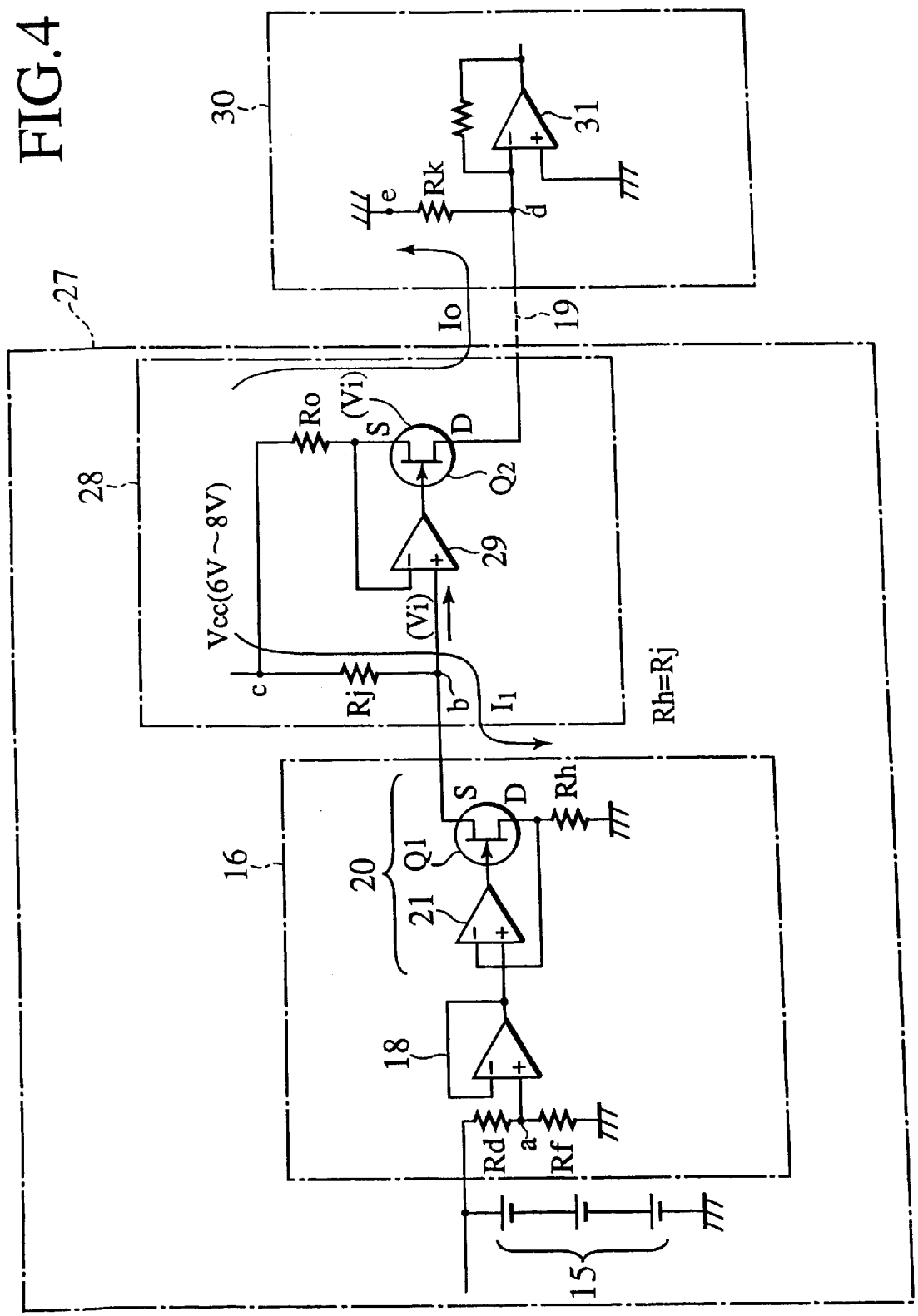
FIG. 4 is a schematic structure diagram of the non-isolated type voltage sensor according to the second embodiment.

Thus, a non-isolated type voltage sensor 27 is proposed by providing further a voltage-current conversion circuit 28 as shown in FIG. 4. In the voltage-current conversion circuit 28 of this non-isolated type voltage sensor 27, a connecting end b of a resistor $R_j$ (called second pull-up resistor also) having the same resistance as the resistor $R_h$ (first output resistor) of the non-isolated type voltage sensor 16 (hereinafter referred to as the voltage detection circuit 16 in the second embodiment) is connected to a source of the $FETQ_1$. A connecting end c of the resistor $R_j$ is connected to the reference power supply (voltage between 6V and 8V).

This voltage-current conversion circuit 28 further comprises an amplifier 29, $FETQ_2$ and resistor $R_0$ (called second output resistor also). A plus input of the amplifier 29 is connected to a voltage dividing point b (corresponded to the connecting end b) between the resistor $R_j$ and resistor $R_h$ and a minus output thereof is connected to a source of the $FETQ_2$. Further, an output of the amplifier 29 is connected to a gate of the $FETQ_2$ so as to form a high-speed voltage follower. The resistor $R_0$ which is connected to the reference power supply $V_{cc}$ is connected to the source of the $FETQ_2$.

On the other hand, an input interface of the battery controller 30 is comprised of a resistor $R_k$ and a differential amplifier 31. A connecting end d of this resistor $R_k$ is connected to the wire harness 19 while a connecting end e thereof is connected to grounding.

Then, the differential amplifier 31 amplifies a voltage $v_j$ generated by the current $I_0$ flowing through the resistor $R_k$ and after that, inputs this into an operating portion (not shown). The operating portion samples this inputted voltage every 1 msec and averages samples of a predetermined quantity. When a predetermined number of the average data is collected, a battery voltage is estimated using the current $I_0$ obtained by calculating this average data.

An operation of the non-isolated type voltage sensor of the second embodiment having such a structure will be described below.

If a discharge current of the battery 15 flows through the resistors $R_d$, $R_f$ of the voltage detection circuit 16, a voltage dividing value (5V max.) is generated based on the resistors $R_d$, $R_f$ at the voltage dividing point a. With this voltage dividing value as a detected voltage for the battery 15, its impedance is converted by the voltage follower 18.

An output of the voltage follower 18 is inputted to plus side of the amplifier 21 of the voltage-current conversion circuit 20 and the amplifier 21 sends a weak signal of low impedance to a gate of the $FETQ_1$.

Consequently, the $FETQ_1$ is turned ON immediately so that the current $I_1$ flows from the resistor $R_j$ of the voltage-current conversion circuit 28 at the subsequent stage to the $FETQ_1$, resistor $R_h$ and ground in succession.

Further, the voltage $v_1$ is generated at the voltage dividing point b of the voltage-current conversion circuit 28 and inputted to the non-inverted input of the amplifier 29. The amplifier 29 sends a difference signal with respect to the non-inverted input to the gate of the $FETQ_2$. Consequently, the $FETQ_2$ is turned ON immediately so that the output current $I_0$ (voltage is $v_t$) is sent from the resistor $R_0$ to the battery controller 30 through the wire harness 19.

Therefore, the output of the non-isolated type voltage sensor 27 is sent to the battery controller 30 as a current signal. As a result, influences of the wire harness and the reference power supply are decreased largely, so that the differential amplification of the battery voltage can be carried out accurately on the side of the battery controller 30 with the ground level as a reference.

What is claimed is:

1. A non-isolated type voltage sensor provided between a battery and a circuit having a pull-up resister which is connected to a reference power supply and a cable, the non-isolated type voltage sensor comprising:

a voltage dividing circuit comprising a plurality of resistors connected in series such that the voltage dividing circuit is connected to said battery in parallel, so as to obtain a voltage proportional to a terminal voltage of said battery and less than said reference voltage at a desired voltage dividing point of said plural resistors;

a voltage follower which receives an input of a voltage from the voltage dividing point of said voltage dividing circuit; and a voltage-current conversion circuit in which an input thereof is connected to an output of said voltage follower while an output thereof is connected to said cable so that a current proportional to a low impedance output voltage obtained through said voltage follower flows to the ground through an output resistor.

2. A non-isolated type voltage sensor according to claim 1 wherein said voltage-current conversion circuit comprises:

a field effect transistor a source of which is connected to said cable while a drain thereof is connected to said output resistor;

an output resistor which is connected to a drain of said field effect transistor and said ground, the output resistor having a resistance higher than a resistance of said pull-up resistor; and an amplifier in which an output of said voltage follower is connected to a non-inverted input thereof, an inverted input thereof is connected to said output resistor and an output thereof is connected to a gate of said field effect transistor.

3. A non-isolated type voltage sensor provided between a battery and a circuit having a pull-up resistor which is connected to ground and a cable, including:

a voltage detecting circuit for obtaining a voltage proportional to a voltage of said battery at a voltage dividing point and supplying a first current proportional to a low impedance output voltage obtained from a voltage at said voltage dividing point to the ground through a first output resistor; and a voltage-current conversion circuit for supplying a second current proportional to a voltage signal determined by said first current to said cable through a second output resistor.

4. A non-isolated type voltage sensor according to claim 3 wherein said circuit having the first pull-up resistor includes a differential amplifying circuit which is connected to the same type of ground as ground of said battery and said cable, the differential amplifying circuit carrying out differential amplification with said ground as a reference, said voltage detecting circuit comprising:

a voltage dividing circuit containing a plurality of resistors connected in series such that the voltage dividing circuit is connected to said battery in parallel, so as to obtain a voltage proportional to a terminal voltage of said battery and less than said reference voltage at a desired voltage dividing point of said plural resistors;

a voltage follower which receives an input of a voltage at the voltage dividing point of said voltage dividing circuit; and a first voltage-current conversion circuit in which an input thereof is connected to an output of said voltage follower so that said first current obtained through said voltage follower and proportional to a low impedance output voltage flows to the ground through said first output resistor, said voltage-current conversion circuit being comprised of a second voltage-current conversion circuit in which a second pull-up resistor having the same resistance as said first output resistor, said pull-up resistor being connected to the reference power supply, and supplies said second current proportional to a low impedance output voltage obtained from a voltage signal at the connecting point between said second pull-up resister and said first voltage-current conversion circuit to said cable through said second output resistor.

5. A non-isolated type voltage sensor according to claim 4 wherein said first voltage-current conversion circuit comprises:

a first field effect transistor a source of which is connected to an input of said second voltage-current conversion circuit while a drain thereof is connected to said first output resistor;

a first output resistor which is connected to a drain of said first field effect transistor and said ground; and a first amplifier in which an output of said voltage follower is connected to a non-inverted input thereof, an inverted input thereof is connected to said first output resistor and an output thereof is connected to a gate of said field effect transistor, said second voltage-current conversion circuit comprising:

a second pull-up resistor which is connected to said reference power supply and a source of said first field effect transistor;

a second output resistor which is connected to said reference power supply;

a second field effect transistor a source of which is connected to said second output resistor while a drain thereof is connected to said cable; and a second amplifier in which a non-inverted input thereof is connected to a source of said first field effect transistor, a non-inverted input thereof is connected to said second output resistor and a source of said second field effect transistor and an output thereof is connected to a gate of said second field effect transistor.

* * * * *

UNITED STATES PATENT AND TRADEMARK OFFICE
CERTIFICATE OF CORRECTION

PATENT NO. : 6,489,786 B1
DATED : December 3, 2002
INVENTOR(S) : Hisashi Takemoto and Syuji Satake It is certified that error appears in the above-identified patent and that said Letters Patent is hereby corrected as shown below:

Column 6,
Line 62, "resister" should read -- resistor --.

Column 8,
Line 18, "resister" should read -- resistor --.

Signed and Sealed this

Eighteenth Day of March, 2003

JAMES E. ROGAN
*Director of the United States Patent and Trademark Office*